United States Patent [19]

Anderson et al.

[11] Patent Number: 5,361,967
[45] Date of Patent: Nov. 8, 1994

[54] MONOLITHIC CIRCUIT FABRICATION METHOD

[75] Inventors: Michael J. Anderson, Phoenix; Howard D. Knuth, Tempe; Wayne D. Pasco, Scottsdale, all of Ariz.

[73] Assignee: Motorola, Inc., Schaumburg, Ill.

[21] Appl. No.: 149,900

[22] Filed: Nov. 10, 1993

[51] Int. Cl.[5] ............................................. H01L 21/52
[52] U.S. Cl. ......................... 228/124.6; 228/208; 228/254; 427/96; 427/124; 427/282; 118/721; 118/504; 437/221; 437/245
[58] Field of Search .............. 228/123.1, 124.1, 124.6, 228/208, 214, 254; 427/99, 96, 124, 143, 282; 118/504, 721; 437/221, 245

[56] References Cited

U.S. PATENT DOCUMENTS

| | | | |
|---|---|---|---|
| 3,895,155 | 7/1975 | Shukuri et al. | 428/206 |
| 4,013,502 | 3/1977 | Staples | 156/608 |
| 4,404,755 | 9/1983 | Resneau et al. | 228/124.6 |
| 4,434,544 | 3/1984 | Dohya et al. | 29/578 |
| 4,582,395 | 4/1986 | Morozumi | 350/334 |
| 4,904,555 | 2/1990 | Grossa | 430/25 |

OTHER PUBLICATIONS

Selected pages from a catalog Micro–Screen Precision Products, A Division of Syscon International, Inc. 1108 S. High Street, South Bend, Ind. 46618, (219) 232-3900, (800) 348-2993 with an article entitled Viano's CDF Direct–Film System from CDF Family Bulletin, vol. 986.

*Primary Examiner*—Samuel M. Heinrich
*Attorney, Agent, or Firm*—Frederick M. Fliegel

[57] ABSTRACT

A monolithic circuit, such as a piezoelectric device, semiconductor, or the like, may be fabricated by forming an operational metallization layer (12) on a substrate (10). A subsequent layer (40), such as a sealing ring pattern (42) may then be applied using a thin film deposition technique. A thin film material is applied through a mask assembly (28). The mask assembly (28) includes a mask material (30) that has been applied to a screen (24) and patterned as desired. The mask material (30) extends beyond the screen (24) so that only the mask material contacts the substrate (10) during thin film deposition. Preferably, the screen (24) is woven from individual wires (26) having circular cross-sectional shapes. The subsequent layer (40) is applied both through perforations (18) in the screen (24) and under the screen's wires (26).

21 Claims, 4 Drawing Sheets

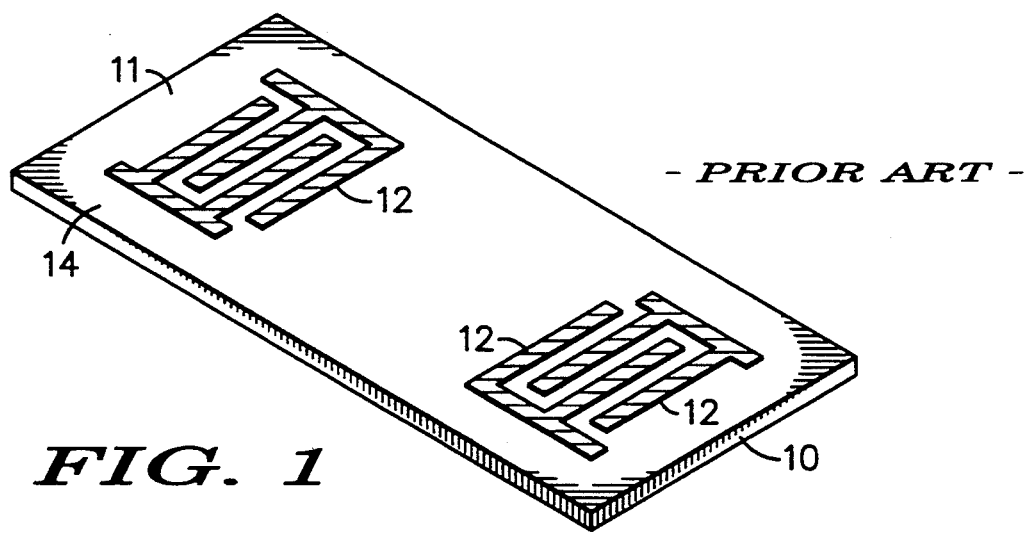
*FIG. 1* — PRIOR ART
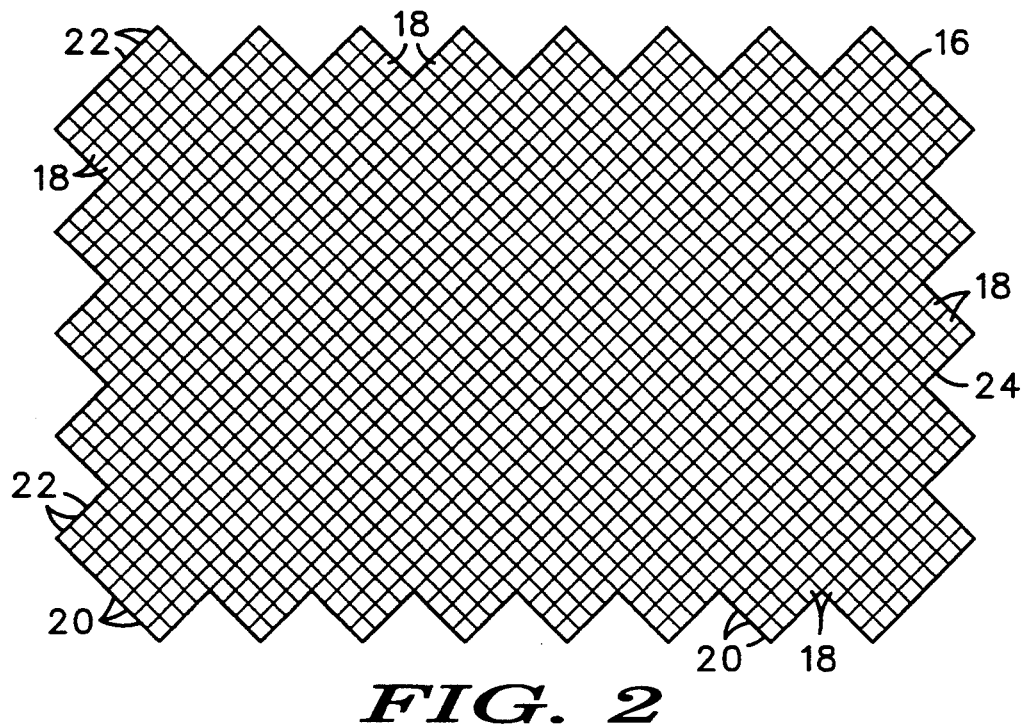
*FIG. 2*
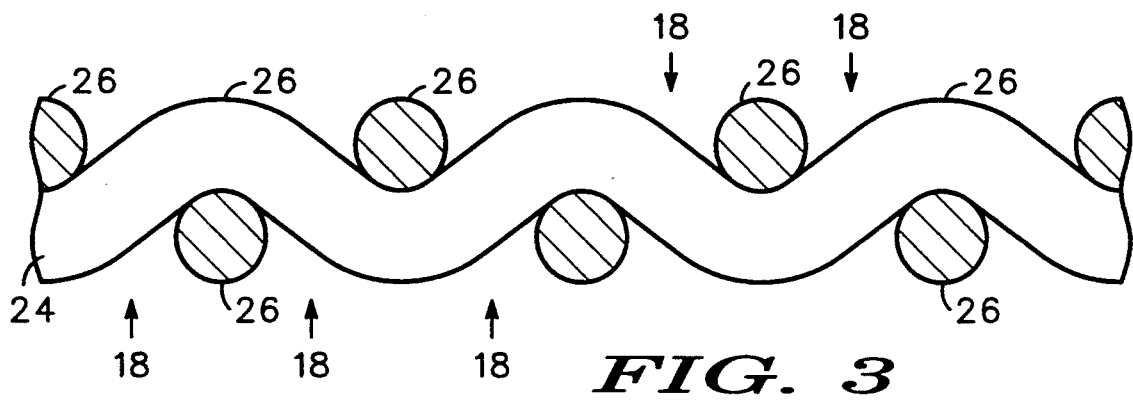
*FIG. 3* ic circuits. More specifically, the present invention relates to using a mask with thin film deposition techniques to fabricate rings, spirals, and similar patterns in monolithic circuits.

MONOLITHIC CIRCUIT FABRICATION METHOD

TECHNICAL FIELD OF THE INVENTION

The present invention relates generally to the fabrication of monolithic circuits. More specifically, the present invention relates to using a mask with thin film deposition techniques to fabricate rings, spirals, and similar patterns in monolithic circuits.

BACKGROUND OF THE INVENTION

Monolithic circuits, such as semiconductors, piezoelectric devices, ceramic filters, and the like, often require diverse materials to reside in diverse areas of a common substrate. Conventional thin film patterning, depositing, and etching techniques may be employed to successfully position the diverse materials at diverse areas of a substrate.

While these conventional techniques work well, they are occasionally unduly complex and expensive. For example, protective layers must often be applied in predetermined patterns to protect against unwanted etching. After etching, the protective layers must then be removed. Moreover, when several different materials are involved, separate etching steps may be required for each material. Consequently, if a material or several different materials can be applied using a process that does not require etching, significant savings may be obtained over the conventional thin film patterning, depositing, and etching techniques.

A conventional shadow masking process need not require etching steps. A shadow mask is a stencil. In a conventional shadow masking process, a mask is prepared in which a pattern to be formed represents an open or void area through the mask. A thin film deposition process may be used to deposit a material through the open area of the mask. Areas where a material is not to be applied are blocked by solid portions of the mask. Material is applied to a substrate only where permitted by the shadow mask, and etching steps are not required. On the other hand, conventional shadow masking processes do not work for all types of patterns.

In particular, conventional shadow masks do not support continuous ring, spiral, and like patterns. These patterns require the mask to include an open portion that, for the most part, surrounds a solid portion. The mask cannot mechanically hold the surrounded solid portion inside the open portion without running a solid "land" region across the open portion. When the pattern is a sealing ring to which a cap will attach to hermetically seal the monolithic circuit, the solid land region would produce a discontinuity or void in the sealing ring that would spoil any hermetic seal.

Thick film deposition techniques have been used to form continuous ring, spiral, and like patterns. Thick film techniques form a mask with open and solid areas on a screen. A viscous liquid material is then forced through the screen in open areas of the mask. The material may then flow together under the screen to smooth out any discontinuities caused by the screen. Thus, a continuous pattern may result. Unfortunately, the requirement for a liquid-like material makes this technique unworkable in many situations. The flowable nature of the material can require such high temperatures that the substrate and/or any prior processing on the substrate become damaged. Moreover, the flowable nature of the material often prevents high resolution patterning.

SUMMARY OF THE INVENTION

Accordingly, it is an advantage of the present invention that an improved method is provided for fabricating a monolithic circuit having a continuous pattern formed on a substrate.

Another advantage of the present invention is that a method for using a mask with thin film deposition techniques to form a continuous, closed or substantially closed pattern, such as a ring or a spiral, is provided.

Another advantage is that the present invention provides a method for using a screen to form a continuous pattern while maintaining a relatively low temperature.

Another advantage of the present invention is that a method for fabricating a surface acoustic wave (SAW) device is provided in which a sealing ring material surrounds operational materials used for the SAW device.

The above and other advantages of the present invention are carried out in one form by a method for fabricating a monolithic circuit having a continuous pattern formed on a substrate. The method calls for obtaining a sheet-like material having a multiplicity of perforations therethrough. A first portion of the perforations is blocked to correspond to a negative of the pattern. A second portion of the perforations that corresponds to the pattern remains unblocked. The sheet-like material is spaced away from the substrate so that the substrate is prevented from contacting the sheet-like material proximate the second portion of the perforations. A thin film deposition process is used to deposit a material on the substrate through the second portion of the perforations.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 1 diagrammatically shows a perspective view of a substrate upon which an operational metallization layer for a surface acoustic wave (SAW) device has been formed in accordance with the prior art;

FIG. 2 diagrammatically shows a screen used in accordance with the method of the present invention;

FIG. 3 shows a close-up, side view of a portion of the screen of FIG. 2;

DETAILED DESCRIPTION OF THE PREFERRED EMBODIMENTS

Figure 4:
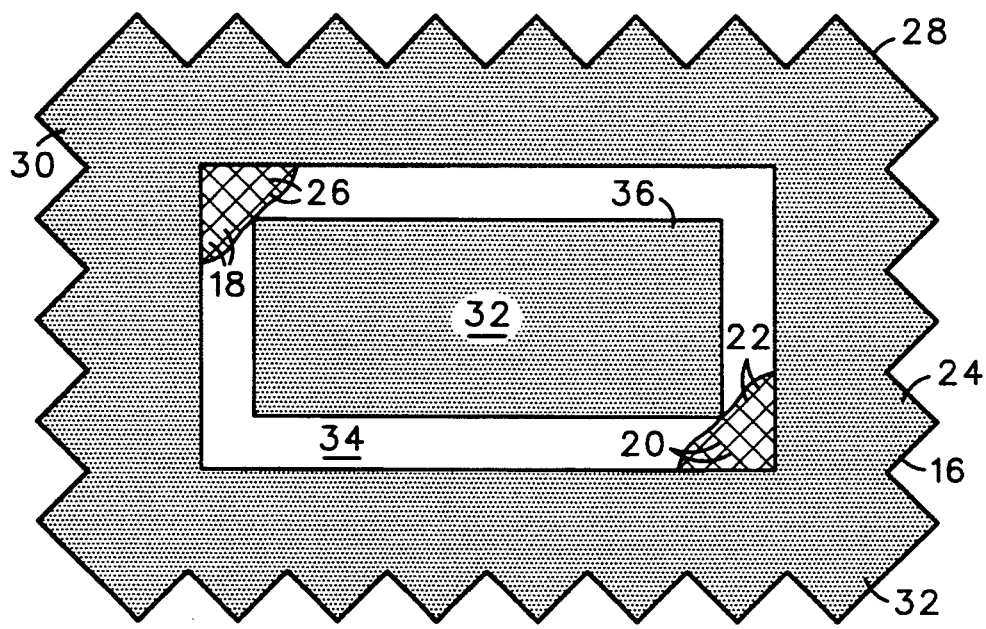
FIG. 4 shows a top view of a mask assembly formed using the screen shown in FIGS. 2 and 3.

FIG. 1 diagrammatically shows a perspective view of a substrate 10 having an active surface 11 upon which an operational metallization layer and pattern 12 for a surface acoustic wave (SAW) device 14 has been formed. The formation of SAW device 14 as depicted in FIG. 1 is accomplished through conventional processes. Substrate 10 represents a piezoelectric material, such as quartz, lithium tantalate, lithium niobate, lithium tetraborate and the like, and operational metallization layer 12 may desirably represent aluminum (Al), which has been patterned and deposited in a conventional manner.

As is well known to those skilled in the art, the SAW device 14 depicted in FIG. 1 is relatively sensitive and fragile. The electrical performance of SAW device 14 may significantly vary in response to the physical environment experienced by SAW device 14. Thus, additional processing is performed to hermetically seal SAW device 14. In addition, operational metallization layer 12 may become damaged if SAW device 14 experiences excessive temperatures, such as above 450° C., a Curie temperature of the substrate 10 or a temperature or temperature gradient inconsistent with the pyroelectric and other properties of substrate 10. Thus, the additional processing performed to seal SAW device 14 desirably maintains temperatures at less than 450° C.

FIGS. 2–9 and the accompanying description presented below describe a technique for forming a sealing ring that surrounds operational metallization pattern 12 and for attaching a cap to the sealing ring. While this technique is believed to be advantageous in the fabrication of SAW devices, it is by no means limited strictly to use in connection with SAW devices. Rather, this technique may be applied to the fabrication of semiconductor devices, hybrid devices, filters, or other monolithic circuits that are formed by the application of various materials to various areas of a common substrate.

This technique is believed to be advantageous in forming continuous rings, spirals, peninsulas, and like patterns. These patterns have a common feature in that the pattern to be formed substantially surrounds a non-patterned region. In the case of a ring, the ring itself is the pattern and the center of the ring represents the non-patterned region. The pattern is continuous. When the pattern serves as a sealing ring, continuity allows a successful seal to be realized. In the case of a ring pattern, the patterned region completely surrounds a non-patterned region. However, this is not a requirement and the below-discussed technique may be practiced with virtually any pattern shape. In the case of spirals and peninsulas the non-patterned region is mostly surrounded by a patterned region. When the non-patterned region is mostly or completely surrounded by a patterned region, a conventional shadow mask has trouble physically holding a solid, shadow portion of the mask in the interior of an open, patterned region without corrupting the continuity of the open region. The below-discussed technique represents an alternative to a conventional shadow mask process, and the below-discussed technique successfully forms continuous rings, spirals, peninsulas, and like patterns.

FIG. 2 diagrammatically shows a sheet-like material 16 that is obtained in order to form a mask assembly, discussed below. Material 16 is desirably larger than the area to be patterned on substrate 10 (see FIG. 1), and has a multiplicity of perforations 18 therethrough. Each perforation 18 represents an open or void area that is surrounded by solid material. Perforations 18 are configured to cause material 16 to have a high percentage of open area, preferably greater than 30%. This open area may be evenly distributed throughout material 16. In the preferred embodiments of the present invention, the open area is around 50% or more. As illustrated in FIG. 2, perforations 18 may be arranged in rows 20 and columns 22 that are approximately perpendicular to one another.

While sheet-like material 16 may be formed by making holes through a solid material, a woven stainless steel screen 24 is a more preferred example for material 16. FIG. 3 shows a close-up, side view of a portion of screen 24. Screen 24 includes a multiplicity of spaced apart individual wires 26. Each of the multiplicity of perforations 18 is surrounded by portions of a plurality of the wires 26. Wires 26 have generally circular cross-sectional shapes. The woven nature of screen 24 imposes a transverse variation in the location of wires 26 over the area of screen 24. This transverse variation and circular cross-sectional shape provide advantages in performing a line-of-sight deposition task, discussed below. One embodiment which produces successful results uses an 80 mesh screen in which individual wires 26 have a diameter of less than 100 micrometers and preferably less than 50 micrometers. Equally suitable would be a 325 mesh screen in which individual wires 26 have a diameter of less than 22.5 micrometers. Those skilled in the art will appreciate that the features of screen 24 may be exaggerated in FIGS. 2 and 3 for clarity.

FIG. 4 shows a top view of a mask assembly 28 formed using screen 24. A mask material 30 is applied to screen 24 forming one or more blocked-perforation regions 32. A region 34 of perforations 18 remains unblocked. Blocked perforations 32 form a region whose shape corresponds to a negative of the pattern to be formed on substrate 10 (see FIG. 1). Unblocked perforations 34 form a region whose shape corresponds to the pattern to be formed on substrate 10. As illustrated in FIG. 4, an interior section 36 of blocked perforations 32 is surrounded by unblocked perforations 34. Moreover, in the example depicted by FIG. 4, the region of unblocked perforations 34 is configured in the shape of a ring and dimensioned to surround operational metallization pattern 12 (see FIG. 1).

For clarity, FIG. 4 shows only a fraction of the solid portions of screen 24, such as wires 26, which are present in the region defined by unblocked perforations 34. Moreover, the spacing and/or relative size of these wires 26 may appear exaggerated for clarity. While wires 26 extend across the region defined by unblocked perforations 34, mask material 30 does not extend across this region to interior section 36 for the ring pattern depicted in this example.

Moreover, rows 20 and columns 22 of screen 24 are oriented relative to the pattern to be formed on substrate 10. When this pattern has straight line features, as illustrated in the rectangular ring shape shown in FIG. 4, the straight pattern lines are desirably oriented at oblique angles to rows 20 and columns 22. This orientation provides advantages in performing a line-of-sight deposition task, discussed below.

Figure 5:
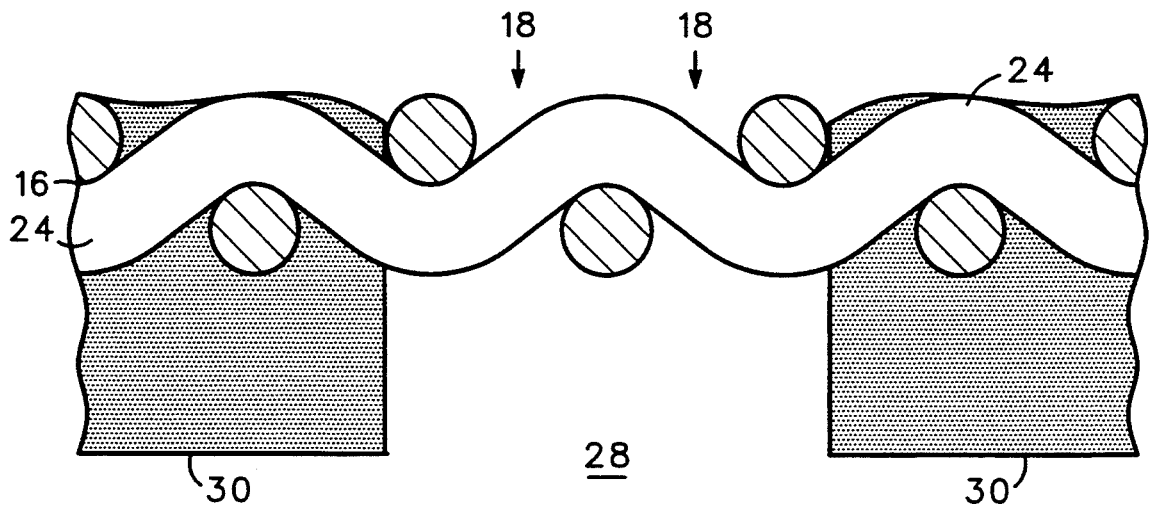
FIG. 5 shows a close-up, side view of a portion of the mask assembly.

FIG. 5 shows a close-up, side view of a portion of mask assembly 28. With reference to FIGS. 4 and 5, mask material 30 in the preferred embodiment is selected to be a conventional photosensitive emulsion. Mask assembly 28 may be formed by embedding screen 24 in a water soluble, dry film emulsion. As illustrated in FIG. 5, screen 24 is embedded into mask material 30 only a small distance so that mask material 30 extends beyond screen 24 for a predetermined distance, preferably in the 75–1250 micron range. This predetermined distance is unimportant throughout the majority of the areas with blocked perforations 32. However, it becomes more important at the boundaries between blocked perforations 32 and unblocked perforations 34 because this distance that mask material 30 extends beyond screen 24 spaces screen 24 away from substrate 10 in a later-occurring deposition task.

After embedding screen 24 in mask material 30, conventional techniques may be used to expose those portions of mask material 30 that overlie unblocked perforations 34, to remove these portions of mask material 30 from screen 24, and to cure the remaining portions of mask material 30.

While a conventional emulsion represents one type of mask material 30 which may be used with screen 24 to form mask assembly 28, those skilled in the art will appreciate that alternate materials 30 may also work satisfactorily. For example, polyimide, epoxy, and other materials may alternatively be used in particular situations.

Figure 6:
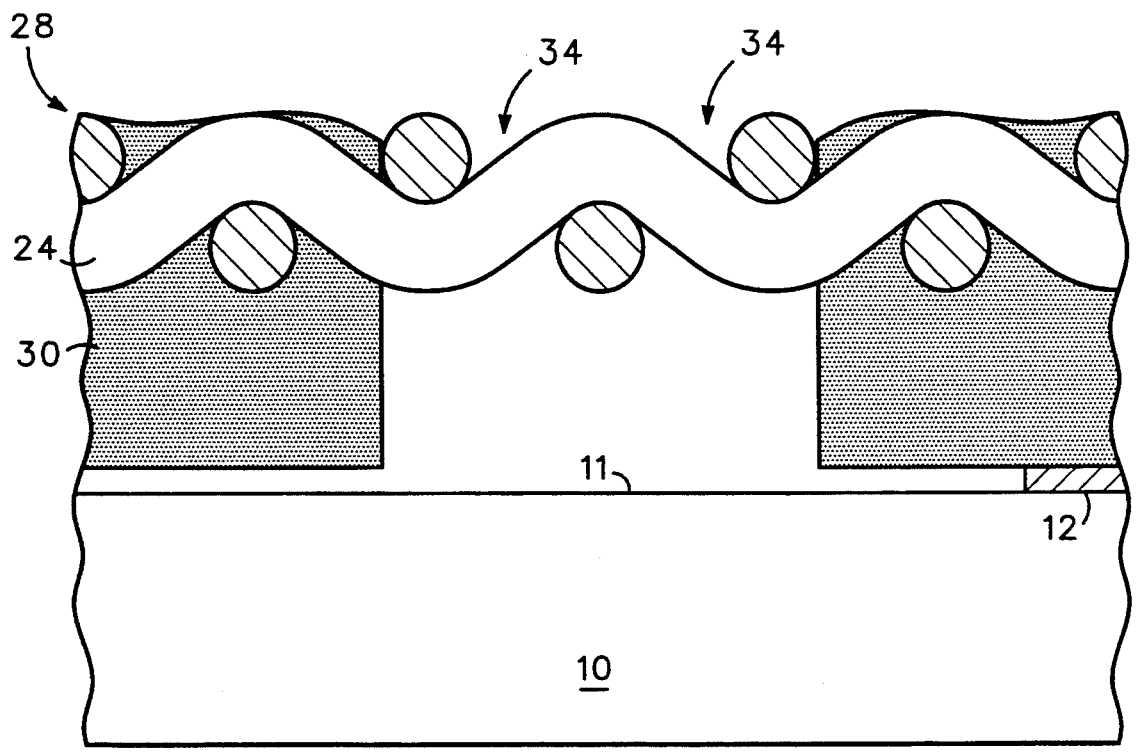
FIG. 6 shows a close-up, side view that illustrates the juxtaposition of the mask assembly with the substrate.

FIG. 6 shows a close-up, side view that diagrammatically illustrates the juxtaposition of mask assembly 28 against substrate 10. After the formation of mask assembly 28, mask assembly 28 may be placed against active surface 11 of substrate 10. The region defined by unblocked perforations 34 is aligned as desired with pattern 12 on substrate 10. For the example of SAW device 14 (see FIG. 1), the ring-shaped region defined by unblocked perforations 34 is positioned to surround operational metallization pattern 12 (see FIG. 1). Mask assembly 28 is positioned with the extended portion of mask material 30 in contact with active surface 11 of substrate 10. This orientation spaces screen 24 away from active surface 11 by the predetermined distance (discussed above) that mask material 30 extends beyond screen 24. In other words, screen 24 is prevented from contacting active surface 11 by the extension of mask material 30 beyond screen 24. After mask assembly 28 has been desirably positioned relative to substrate 10, it is clamped or otherwise held in place for further processing.

Figure 7:
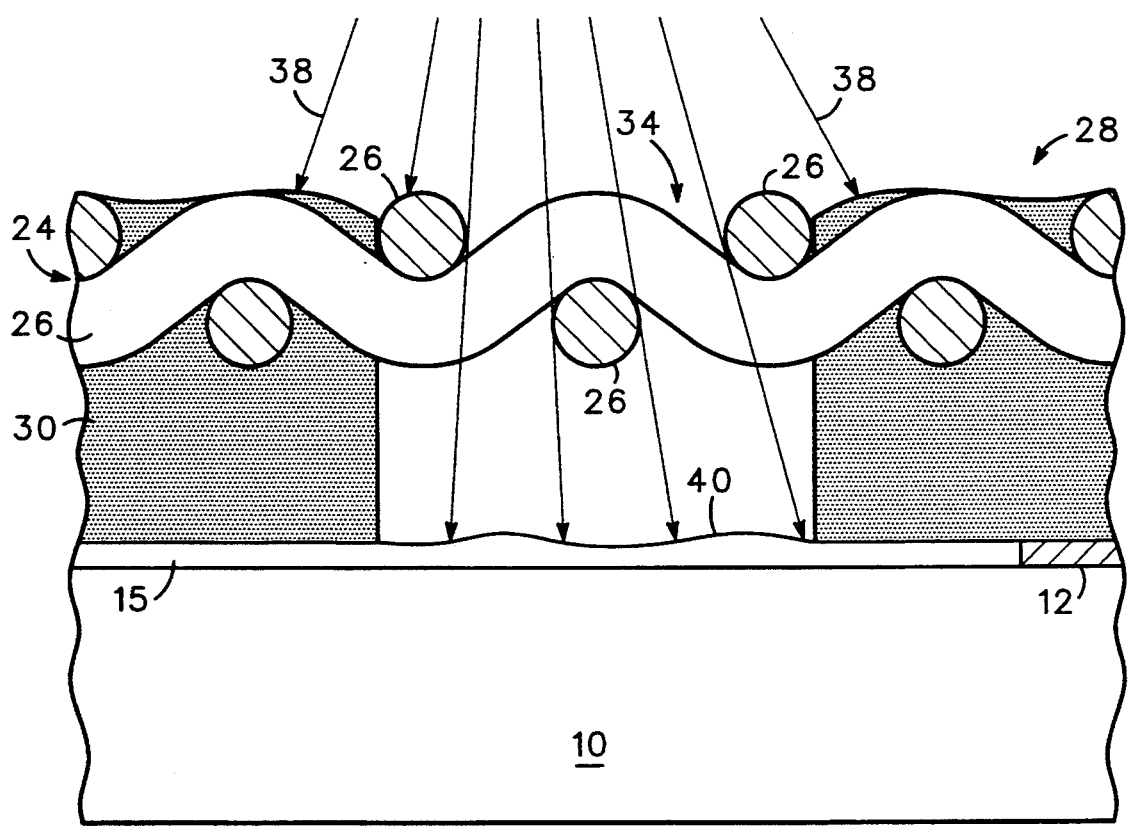
FIG. 7 illustrates the deposition of a material through the mask assembly using a thin film deposition technique.

FIG. 7 diagrammatically illustrates the deposition of a material through mask assembly 28 using a conventional low temperature thin film deposition technique. Accordingly, mask assembly 28 and substrate 10 are placed inside a thin film deposition chamber (not shown). Thin film deposition techniques include vacuum deposition, sputter deposition, evaporation deposition, and ion implantation. These well known thin film techniques essentially perform line-of-sight deposition. In other words, the material being deposited travels in substantially straight lines 38 from a source (not shown) to a target, such as substrate 10.

Due to the line-of-sight deposition characteristic, thin film deposition techniques can achieve fine resolution patterns on the target. However, this fine resolution poses a problem which the current technique overcomes. Namely, it is desirable that a continuous pattern be deposited and that the outline of screen 24 not be transferred to substrate 10. Shadows cast by wires 26 of screen 24 on substrate 10 could lead to discontinuities or voids in the material being deposited.

The current technique prevents the casting of shadows by wires 26 by spacing screen 24 away from active surface 11 of substrate 10, as discussed above. This allows line-of-sight deposition underneath wires 26 from a source located a conventional distance away from surface 11. In addition, the circular cross-sectional shape of wires 26, the transverse variation of wire 26 over screen 24, and the orientation of screen 24 at an oblique angle to the pattern being formed all add to the ability of the thin film deposition techniques to deposit material under wires 26 because they increase the range of angles available between points underneath wires 26 and the material source. Moreover, substrate 10 and mask assembly 28 may be mounted within the deposition chamber on a moving planetary structure to further increase the diversity of angles available between points underneath wires 26 and a material source.

Consequently, a layer 40 of a material is deposited through unblocked perforations 34 in mask assembly 28 to form a continuous selective pattern on substrate 10. Since mask material 30 contacts surface 11 of substrate 10, layer 40 is confined substantially to the open region defined by mask assembly 28. Layer 40 may not be perfectly flat as a result of this deposition technique. However, screen parameters and spacing distances may be adjusted to achieve a desired degree of flatness at the surface of layer 40.

In accordance with the fabrication of SAW device 14 (see FIG. 1), the material being deposited is compatible with a later-occurring soldering operation. Thus, layer 40 represents a metallization layer that differs from the operational metallization layer 12 (see FIG. 1) required by SAW device 14. In fact, layer 40 may represent a combination of a plurality of discrete metallization layers, such as Chromium (Cr), Copper (Cu), Nickel (Ni), and Gold (Au), in that order. Since these multiple layers are deposited without a need to etch any of the layers, a considerable savings results when compared to conventional photolithographic patterning, depositing and etching techniques. Those skilled in the art will appreciate that this metallization is suitable for soldering. However, other materials, such as glass, may be deposited in a similar manner to achieve a similar objective.

Moreover, those skilled in the art will appreciate that thin film deposition techniques permit temperatures at substrate 10 to remain well below 450° C. These low temperatures, relative to the temperatures typically required to apply metallization using thick film techniques, prevent damage to substrate 10 and to the processes previously performed on substrate 10.

After layer 40 has been deposited, substrate 10 may be removed from the deposition chamber and removed from mask assembly 28. Mask assembly 28 may be saved and reused in subsequent similar deposition tasks with other substrates 10.

Figure 8:
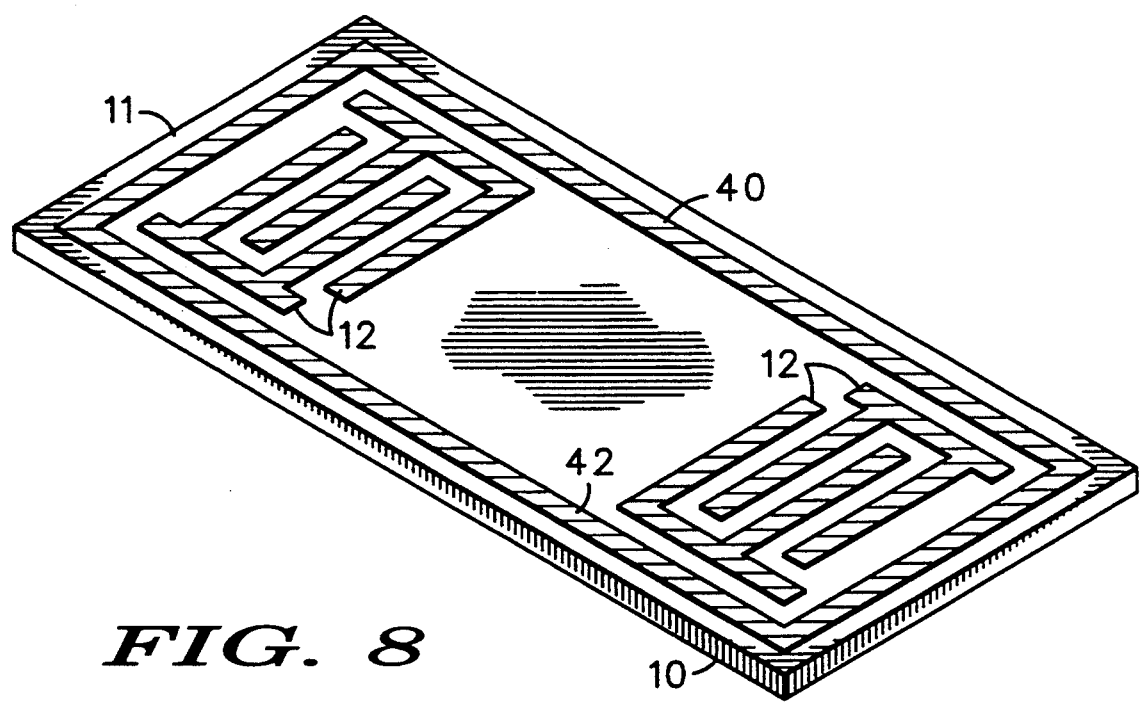
FIG. 8 shows a sealing ring formed as a result of the deposition illustrated in FIG. 7.

FIG. 8 shows layer 40 in the shape of a sealing ring 42 that surrounds operational metallization pattern 12 on active surface 11 of substrate 10. As discussed above, sealing ring pattern 42 has a different metallization than operational metallization pattern 12. Sealing ring 42 forms a continuous pattern. In other words, substantially no voids, seams, or other discontinuities are present in pattern 42.

Figure 9:
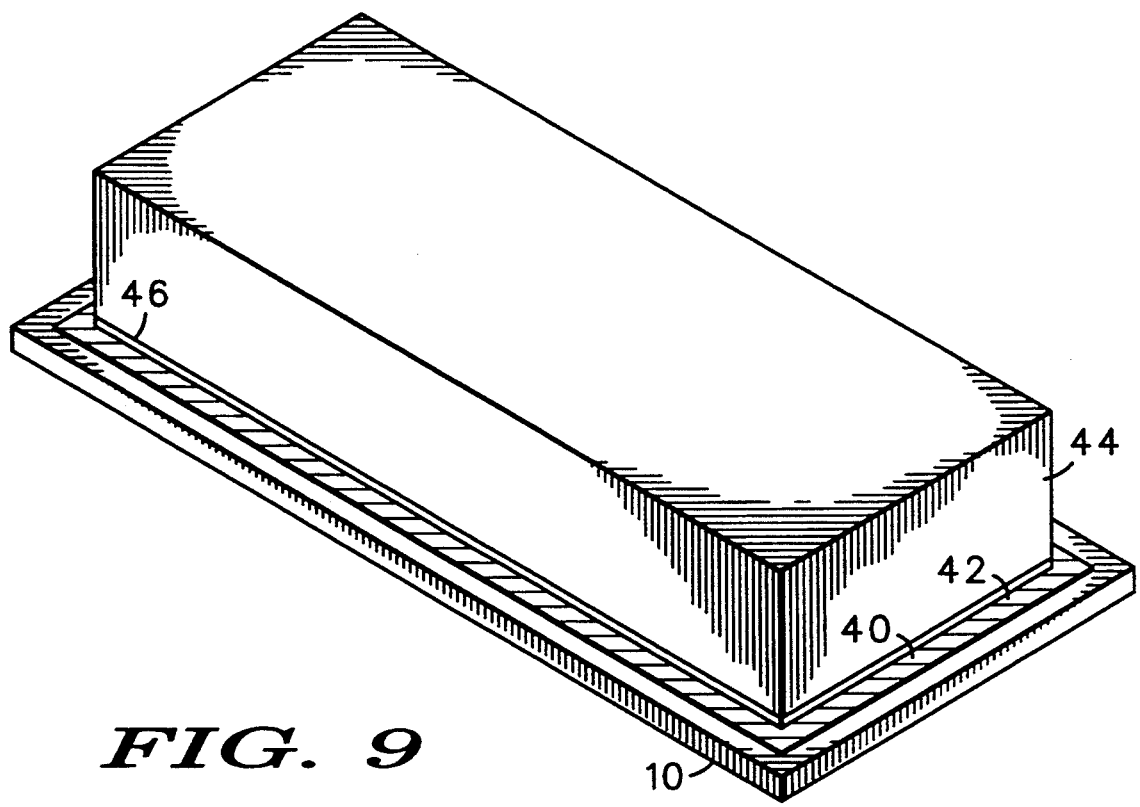
FIG. 9 shows a cap installed on the sealing ring.

The above-discussed tasks may be performed simultaneously for several dice at a wafer level (not shown) if desired. After the formation of sealing ring pattern 42 on substrate 10, a wafer may be separated into individual die, where each die includes one sealing ring 42. After separation into individual die, a cap 44 may desirably be installed on substrate 10 to sealing ring pattern 42, as illustrated in FIG. 9. In the preferred embodiment, cap 44 contains a solder layer 46 at its open end. Cap 44 is aligned with and positioned on sealing ring pattern 42 and reflow-soldered using conventional techniques. The solder adheres to sealing ring pattern 42 and levels any non-planarity at the surface of sealing ring pattern 42. This solder attachment forms a hermetic seal which helps maintain a constant physical environment between the interior of cap 44 and that portion of active surface 11 falling within sealing ring 42 on substrate 10.

In summary, the present invention provides an improved method for fabricating a monolithic circuit that has a continuous pattern formed on a substrate. The method uses a mask with thin film deposition techniques to form a continuous, closed or substantially closed pattern, such as a ring or a spiral. In addition, the method uses a screen to form a continuous pattern while maintaining a relatively low temperature. This method may be used to fabricate a wide variety of patterns on a wide variety of monolithic circuits. One particular use fabricates a surface acoustic wave (SAW) device in which a sealing ring material surrounds operational materials used for the SAW device.

The present invention has been described above with reference to preferred embodiments. However, those skilled in the art will recognize that changes and modifications may be made in these preferred embodiments without departing from the scope of the present invention. For example, those skilled in the art will appreciate that the present invention lends itself to a wide variation in material selection and dimensions. The selection of particular materials and dimensions along with other changes and modifications which are obvious to those skilled in the art are intended to be included within the scope of the present invention.

What is claimed is:

1. A method for fabricating a pattern on a substrate, said method comprising steps of:
    obtaining a sheet-like material having a multiplicity of perforations therethrough;
    blocking a first portion of said perforations to correspond to a negative of said pattern so that a second portion of said perforations corresponding to said pattern remains unblocked;
    spacing said sheet-like material away from said substrate so that said substrate is prevented from contacting said sheet-like material proximate said second portion of said perforations; and
    using a thin film deposition process to deposit a material on said substrate through said second portion of said perforations.

2. A method as claimed in claim 1 wherein:
    said using step comprises a step of selecting a sealing ring metallization for use as said material; and
    said method additionally comprises a step of depositing an operational metallization layer on said substrate, said operational metallization differing in composition from said sealing ring metallization.

3. A method as claimed in claim 2 wherein:
    said depositing an operational metallization layer step comprises a step of forming a surface acoustic wave (SAW) device; and
    said method additionally comprises a step of soldering a cap to said sealing ring metallization to hermetically seal said SAW device.

4. A method as claimed in claim 1 wherein said obtaining step comprises a step of selecting a woven member for said sheet-like material.

5. A method as claimed in claim 1 wherein said obtaining step comprises a step of selecting a wire screen which is woven from individual wires having substantially circular cross-sectional shapes.

6. A method as claimed in claim 1 wherein said blocking step comprises steps of:
    applying a mask material to said sheet-like material to block said first portion of said perforations; and
    arranging said mask material so that said unblocked perforations form a region that substantially surrounds a region of blocked perforations.

7. A method as claimed in claim 1 wherein said blocking step comprises steps of:
    embedding said sheet-like material in a mask material; and
    removing portions of said mask material from regions of said sheet-like material which correspond to said pattern.

8. A method as claimed in claim 7 wherein said sheet-like material and said mask together form a mask assembly, and said spacing step comprises steps of:
    extending said mask material beyond said sheet-like material for a predetermined distance; and
    juxtaposing said mask assembly against said substrate so that said mask material contacts said substrate and said sheet-like material is spaced said predetermined distance away from said substrate.

9. A method as claimed in claim 1 wherein:
    said blocking step comprises the step of applying a mask material to said sheet-like material to block said first portion of said perforations and to extend away from said sheet-like material for a predetermined distance, said mask material and said sheet-like material together forming a mask assembly; and
    said spacing step comprises the step of juxtaposing said mask assembly against said substrate so that said mask material contacts said substrate and said sheet-like material is spaced said predetermined distance away from said substrate.

10. A method as claimed in claim 1 wherein:
    said pattern contains a substantially straight line;
    said perforations in said sheet-like material are arranged in approximately perpendicular rows and columns; and
    said blocking step comprises a step of orienting said pattern relative to said columns and rows of said perforations so that said substantially straight line resides at an oblique angle to said columns and rows.

11. A method as claimed in claim 1 wherein said using step comprises a step of maintaining said substrate at a temperature below approximately 450 degrees centigrade.

12. A method for fabricating a monolithic circuit having a continuous pattern formed on a substrate, said method comprising steps of:
    obtaining a screen which is woven from individual wires and which has a multiplicity of perforations each of which is surrounded by portions of said wires;
    applying a mask material to said screen so that said mask material blocks a first portion of said perforations and extends away from said screen for a predetermined distance, said mask material and said screen together forming a mask assembly, and said mask material refraining from blocking a second portion of said perforations, said second portion corresponding to said pattern;
    juxtaposing said mask assembly against said substrate so that said mask material contacts said substrate and said screen is spaced said predetermined distance away from said substrate; and using a thin film deposition process to deposit a material on said substrate through said second portion of said perforations.

13. A method as claimed in claim 12 wherein:

said using step deposits a sealing ring metallization layer on said substrate; and said method additionally comprises a step of depositing an operational metallization layer on said substrate, said operational metallization layer differing in composition from said sealing ring metallization layer.

14. A method as claimed in claim 13 wherein:

said depositing an operational metallization layer step comprises a step of forming a surface acoustic wave (SAW) device; and said method additionally comprises a step of soldering a cap to said sealing ring metallization layer to hermetically seal said SAW device.

15. A method as claimed in claim 12 wherein said using step comprises a step of maintaining said substrate at a temperature below approximately 450 degrees centigrade.

16. A method as claimed in claim 12 wherein said applying step comprises a step of arranging said mask material so that said second portion of perforations forms an unblocked region which substantially surrounds a region of blocked perforations.

17. A method for fabricating a monolithic circuit, said method comprising steps of:

obtaining a piezoelectric substrate;

depositing an operational metallization pattern on said substrate to form a surface acoustic wave (SAW) device;

obtaining a sheet-like material having a multiplicity of perforations therethrough;

blocking a first portion of said perforations in correspondence with a negative of a ring pattern that is dimensioned to surround said operational metallization pattern, said blocking step refraining from blocking a second portion of said perforations that corresponds to said ring pattern;

juxtaposing said sheet-like material with a surface of said substrate so that said second portion of said perforations surrounds said operational metallization pattern and so that said substrate surface is prevented from contacting said sheet-like material; and depositing a sealing ring metallization pattern on said substrate surface through said second portion of said perforations, said sealing ring metallization pattern differing in composition from said operational metallization pattern.

18. A method as claimed in claim 17 additionally comprising a step of soldering a cap to said sealing ring metallization pattern to hermetically seal said SAW device.

19. A method as claimed in claim 17 wherein said obtaining a sheet-like material step comprises a step of selecting a wire screen which is woven from individual wires generally having circular cross-sectional shapes.

20. A method as claimed in claim 17 wherein:

said blocking step comprises a step of applying a mask material to said sheet-like material to block said first portion of said perforations and to extend away from said sheet-like material for a predetermined distance, said mask material and said sheet-like material together forming a mask assembly; and said juxtaposing step comprises a step of placing said mask assembly against said substrate surface so that said mask material contacts said substrate and said sheet-like material is spaced said predetermined distance away from said substrate surface.

21. A method as claimed in claim 17 wherein said depositing a sealing ring metallization pattern step comprises a step of using a thin film deposition process which maintains said substrate at a temperature below approximately 450 degrees centigrade.

* * * * *